(12) United States Patent
Oshida et al.

(10) Patent No.: US 9,177,857 B2
(45) Date of Patent: Nov. 3, 2015

(54) SEMICONDUCTOR DEVICE WITH HIGH RELIABILITY AND MANUFACTURING METHOD THEREOF

(75) Inventors: Daisuke Oshida, Kanagawa (JP); Toshiyuki Takewaki, Kanagawa (JP); Shinji Yokogawa, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 652 days.

(21) Appl. No.: 12/350,448

(22) Filed: Jan. 8, 2009

(65) Prior Publication Data
US 2009/0184421 A1    Jul. 23, 2009

(30) Foreign Application Priority Data

Jan. 21, 2008  (JP) .................................. 2008-010465

(51) Int. Cl.
*H01L 23/52* (2006.01)
*H01L 23/532* (2006.01)
(Continued)

(52) U.S. Cl.
CPC .... *H01L 21/76843* (2013.01); *H01L 21/76807* (2013.01); *H01L 21/76865* (2013.01); *H01L 21/76873* (2013.01); *H01L 21/76877* (2013.01); *H01L 23/53233* (2013.01); *H01L 23/53238* (2013.01); *H01L 2221/1089* (2013.01); *H01L 2924/0002* (2013.01)

(58) Field of Classification Search
CPC ................... H01L 21/76877; H01L 21/76843; H01L 21/76873; H01L 21/76807; H01L 23/53233; H01L 23/53238

USPC ............... 257/347, 741, 769–771, E23.141, 257/E21.575; 438/625–629, 638, 648, 661, 438/687

See application file for complete search history.

(56) References Cited

U.S. PATENT DOCUMENTS 5,913,147 A * 6/1999 Dubin et al. ................... 438/687
6,268,291 B1 * 7/2001 Andricacos et al. .......... 438/694
(Continued)

FOREIGN PATENT DOCUMENTS

CN       1707772 A      12/2005
JP       6-177128       6/1994
(Continued)

OTHER PUBLICATIONS

Chinese Official Action dated Jul. 21, 2011 issued by Chinese Patent Office in Chinese Application No. 200910005079.6 and English Translation.

(Continued)

*Primary Examiner* — Marvin Payen
*Assistant Examiner* — Jeremy Joy
(74) *Attorney, Agent, or Firm* — Young & Thompson (57) ABSTRACT

A semiconductor device is provided, which includes a substrate, an insulator film formed over the substrate, and plural metal wirings with different widths containing copper as a main component and an impurity which is different from copper. The plural metal wirings includes a first metal wiring having a concentration profile where the concentration of the impurity metal increases from the center part of the stacking direction to the surface and the second metal wiring having a concentration profile where the concentration of the impurity metal decreases from the bottom surface of the stacking direction to the surface. Moreover, the width of the second metal wiring may be larger than the width of the first metal wiring.

12 Claims, 10 Drawing Sheets

(51) Int. Cl.
*H01L 21/768* (2006.01)
*H01L 21/70* (2006.01)

(56) References Cited

U.S. PATENT DOCUMENTS

| | | | |
|---|---|---|---|
| 6,455,413 B1* | 9/2002 | Woo et al. | 438/626 |
| 2002/0024142 A1* | 2/2002 | Sekiguchi | 257/758 |
| 2004/0004288 A1 | 1/2004 | Sekiguchi | |
| 2004/0150113 A1* | 8/2004 | Tonegawa | 257/758 |
| 2005/0272258 A1* | 12/2005 | Morita et al. | 438/660 |
| 2006/0012046 A1* | 1/2006 | Koura et al. | 257/758 |
| 2006/0030151 A1* | 2/2006 | Ding et al. | 438/687 |
| 2007/0298605 A1* | 12/2007 | Andryushchenko et al. | 438/626 |

FOREIGN PATENT DOCUMENTS

| | | |
|---|---|---|
| JP | 2002-75995 | 3/2002 |
| JP | 2004-39916 | 2/2004 |
| JP | 2005-158930 | 6/2005 |
| JP | 2006-19708 | 1/2006 |
| JP | 2006-253729 | 9/2006 |

OTHER PUBLICATIONS

Japanese Official Action—2008-010465—Nov. 6, 2012.

* cited by examiner

SEMICONDUCTOR DEVICE WITH HIGH RELIABILITY AND MANUFACTURING METHOD THEREOF

BACKGROUND OF THE INVENTION

1. Field of the Invention

The present invention relates to a semiconductor device and a manufacturing method thereof. Specifically, it relates to a semiconductor device including a wiring layer which contains copper as a main component and a manufacturing method thereof.

2. Description of the Related Art

From the demands of high integration of semiconductor devices in recent years, copper with a low resistance has come to be used as a material for wirings, plugs, and pads, etc.

It is described in JP-A-2005-158930 that a copper alloy film where an impurity is added to a copper film is adopted as a material for wiring as measures against the deterioration of reliability in the case of using copper. The aforementioned patent document describes a semiconductor device having a configuration in which the concentration of the impurity contained in at least one wiring layer of plural wiring layers increases with the width of the wiring.

JP-A-Hei6-177128 describes a semiconductor device which has a copper alloy thin film wiring containing aluminum or silicon. Moreover, JP-A-2004-039916 describes a semiconductor device in which a region containing unevenly distributed metal elements which are different from copper is provided at the vicinity of the upper surface of the metallic region containing copper as a main component.

JP-A-2006-253729 describes a technology for depositing a conduction film where a conduction material containing copper to which platinum etc. is added is deposited by a sputtering method and a buried wiring is formed by plating.

SUMMARY OF THE INVENTION

However, in a narrow wiring with fine pitch, copper ions migrate at the interface between the copper wiring and the cap film, etc. formed thereon, so that a problem arises that the breakdown voltage between the wirings decreases and the Time Dependent Dielectric Breakdown (TDDB) lifetime remarkably decreases On the other hand, in a wide wiring with a wide wiring width, a phenomenon of SIV (Stress Induced Void), where a void caused by stress is created, becomes a problem.

Conventionally, since measures with respect to such wiring size have not been taken, it has been impossible to prevent the decrease of TDDB lifetime in the narrow wiring and SIV in the wide wiring simultaneously.

According to the present invention, a semiconductor device is provided, including a substrate, an insulator film formed over the substrate, and plural metal wirings with different widths which is formed in the insulator film, contains copper as a main component, and contains an impurity metal which is different from copper, in which the plural metal wirings includes a first metal wiring with a concentration profile where the concentration of the impurity metal increases from the center part of the stacking direction to the surface and a second metal wiring with a concentration profile where the concentration of the impurity metal decreases from the bottom surface of the stacking direction to the surface.

Moreover, according to the present invention, a semiconductor device is provided, including a substrate, a first metal wiring which is formed over the substrate, contains copper as a main component, and contains an impurity metal which is different from copper, and a second metal wiring which is formed over the substrate, contains copper as a main component, contains an impurity metal which is different from copper, and is wider than the first metal wiring, in which the first metal wiring has a concentration profile where the concentration of the impurity metal increases from the center part of the stacking direction to the surface and the concentration of the impurity metal of the surface of the first metal wiring is higher than the concentration of the impurity metal of the surface of the second metal wiring.

According to such a configuration, the impurity metal is formed with high concentration at the surface of the narrow wiring, so that migration of copper ions is suppressed at the interface of the cap film formed thereon, the breakdown voltage between the wirings is improved, and the decrease in the TDDB lifetime can be suppressed. On the other hand, in a wiring with a wide width, the decrease in the TDDB lifetime does riot become so big problem. Therefore, there is a possibility that the only disadvantage which arises is the occurrence of an increase in the resistance of the wiring even if the concentration of an impurity is made high at the surface of the wide wiring. However, as described above, a problem, so-called SIV, arises even in a wiring with a wide width In the aspect of the present invention, although the wide wiring also contains an impurity metal, by taking a configuration where the impurity concentration at the surface thereof is not made as high as that of the narrow wiring, the SIV tolerance can be improved without causing unnecessary increase in the resistance of the wiring.

According to the present invention, a manufacturing method of a semiconductor device is provided, including forming a wiring metal in a plurality of grooves with different widths formed in an insulator film which is formed over a substrate, wherein forming the wiring metal includes forming a first seed alloy film containing copper and an impurity metal which is different from copper by using a sputtering method to embed a part of the grooves, planarizing the film thickness of the first seed alloy film at the side wall of the grooves by etching the first seed alloy film, forming a second seed alloy film containing copper and the impurity metal by using a sputtering method over the first seed alloy film to embed a part of the grooves, forming a plated metal layer containing copper as a main component over the second seed alloy film to embed the other part of the grooves, annealing the first seed alloy film, the second seed alloy film, and the plated metal film.

By taking such a configuration, wiring metal with a profile having high concentration of the impurity metal at the surface is formed in the wiring grooves for the narrow wiring with a narrow wiring width, and the wiring metal is formed in which the concentration of impurity at the surface does not become as high as that of narrow wiring in the wiring grooves for the wide wiring with a wide wiring width. As a result, the advantages of the aforementioned semiconductor device can be obtained.

An arbitrary combination of the above-mentioned components and even one in which the present invention is expressed by exchanging methods, devices, etc. a real so effective as a mode of the present invention.

According to the present invention, the decrease of TDDB lifetime in the narrow wiring and SIV in the wide wiring can be effectively prevented simultaneously.

DETAILED DESCRIPTION OF THE PREFERRED EMBODIMENTS

Hereafter, the embodiment of the present invention will be described by using the drawings In all drawings, a similar code is affixed to a similar component and the explanation is omitted arbitrarily.

Figure 1:
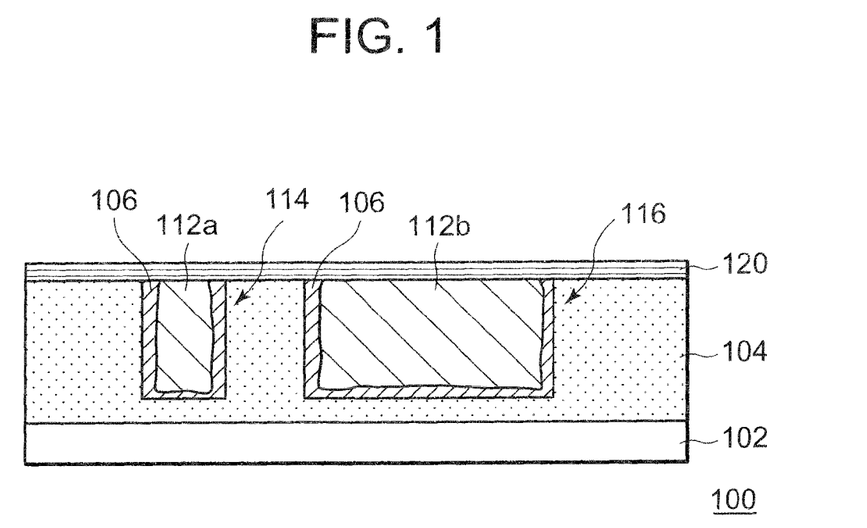
FIG. 1 is a cross-sectional drawing illustrating a configuration of the semiconductor device in the embodiment of the present invention.

FIG. 1 is a cross-sectional drawing illustrating a semiconductor device 100 in this embodiment. The semiconductor device 100 includes a semiconductor substrate (substrate) 102, an interlayer dielectric film 104 formed over the semiconductor substrate 102, a narrow wiring (first metal wiring) 111 and a wide wiring (second metal wiring) 116 formed in the interlayer dielectric film 104, and a cap film 120 formed over the interlayer dielectric film 104, the narrow wiring 114, and the wide wiring 116. Herein, a silicon substrate can be used for the semiconductor substrate 102. Although it is not shown in the figure, a transistor, etc. is formed over the semiconductor substrate 102. Another insulator film may be formed between the semiconductor substrate 102 and the Interlayer dielectric film 104.

The narrow wiring 114 may be, for instance, a wiring with a minimum pitch in the semiconductor device 100. Moreover, the wide wiring 116 may be, for instance, a wiring with the maximum width in the semiconductor device 100.

In this embodiment, the narrow wiring 114 consists of a barrier metal film 106 and the first wiring metal 112a. The wide wiring 116 consists of a barrier metal film 106 and the second wiring metal 112b.

The first wiring metal 112a contains not only copper as a main component but also an impurity metal which is different from copper. The second wiring metal 112b also contains not only copper as a main component but also an impurity metal which is different from copper.

Herein, the concentration profile of the impurity metal in the stacking direction is different between the first wiring metal 112a and the second wiring metal 112b. The first wiring metal 112a has a concentration profile in which the concentration of the impurity metal increases from the center part of the stacking direction to the surface thereof. On the other hand, the second wiring metal 112b has a concentration profile in which the concentration of the impurity metal decreases from the bottom surface to the surface thereof. Moreover, the concentration of the impurity metal at the surface of the first wiring metal 112a is higher than the concentration of the impurity metal at the surface of the second wiring metal 112b.

As the impurity metal, for instance, Be, Mg, Zn, Pd, Ag, Cd, Au, Hg, Pt, Si, Zr, Al and Ti, etc. are illustrated as examples, and one or two or more kinds of those may be contained. When Be, Mg, Zn, Pd, Ag, Cd, Au, Pt or Hg is used as an impurity metal, the rate of increase in the resistances of the narrow wiring 114 and the wide wiring 116 can be suppressed. When Zr or Ti is used for the impurity metal, for instance, the adhesion between the insulator film and the barrier metal film, etc. and the metal film can be improved. When a metal, Mg, Sn, Zn, Cd, etc., which has a lower redox potential than copper is used as an impurity metal, corrosion at the surface of the metal film can be prevented.

As the interlayer dielectric film 104, for instance, a polyorganosiloxane such as HSQ (hydrogensilsesquioxane), MSQ (methylsilsesquioxane), and MHSQ (methylate hydrogensilsesquioxane), etc. an organic material containing an aromatic such as polyarylether (PAE), divinyisiloxane bis-benzocyclobutene (BCB), and Silk (trademark), etc., a low-permittivity material such as SOG (spin on glass), FOX (flowable oxide), Parylene, Cytop, and bensocyclobutene: BCB), etc. can be used.

Figure 2:
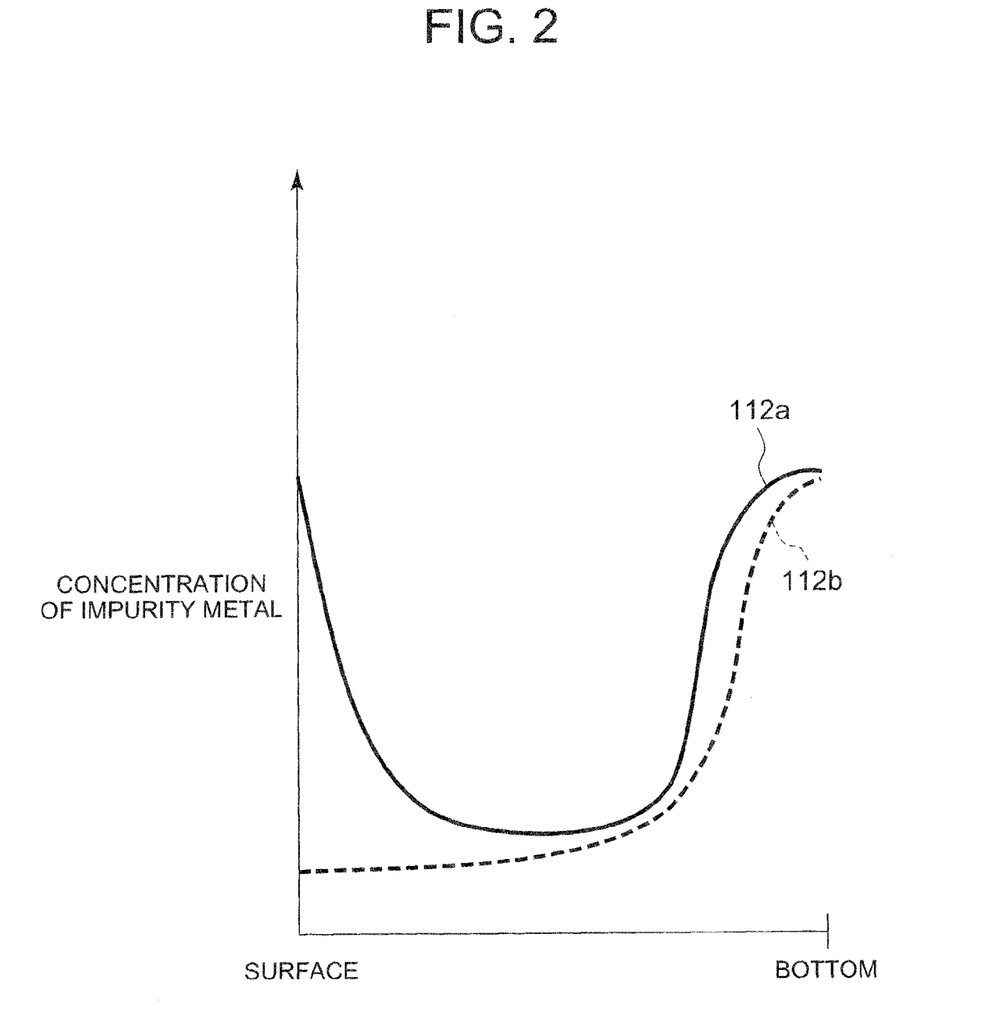
FIG. 2 is a diagram schematically illustrating concentration profiles of the impurity metals in the first wiring metal of the narrow wiring and the second wiring metal of the wide wiring.

FIG. 2 is a schematic drawing illustrating concentration profiles of the impurity metal in the first wiring metal 112a and the second wiring metal 112b. The wiring metal 112a of the narrow wiring 114 has a concentration profile in which the concentration of the impurity metal increases from the center part of the stacking direction to the surface. Moreover, in the first wiring metal 112a, the concentration of the impurity metal at the surface becomes higher than that of the center part Moreover, the concentration of the impurity metal at the surface of the first wiring metal 112a becomes higher than that at the surface of the second wiring metal 112b of the wide wiring 116. On the other hand, the concentration of the impurity metal at the bottom surface is highest and the concentration of the impurity metal gradually decreases toward the surface.

Next, the manufacturing procedure of the semiconductor device 100 of this embodiment will be described. FIG. 3 to FIG. 7 are process cross-sectional drawings illustrating a manufacturing procedure of the semiconductor device 100.

Figure 3A:
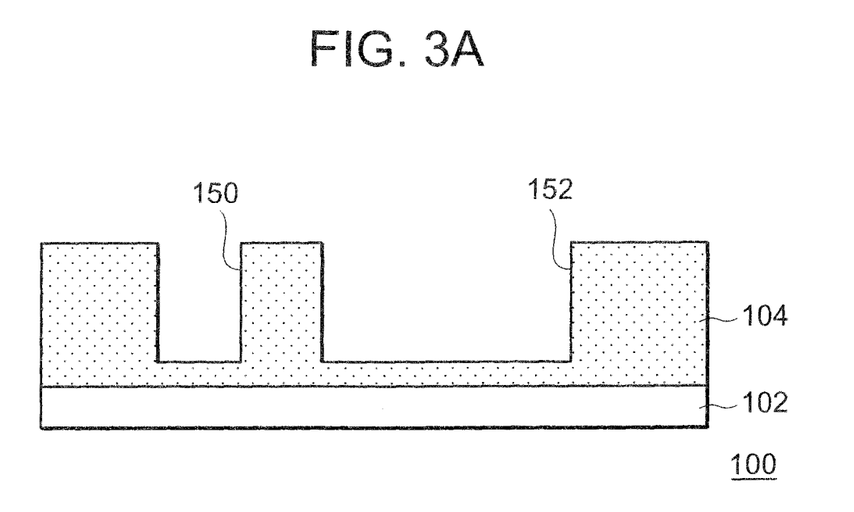
FIG. 3A and FIG. 3B are process cross-sectional drawings illustrating a manufacturing procedure of the semiconductor device in the embodiment of the present invention.
Figure 3B:
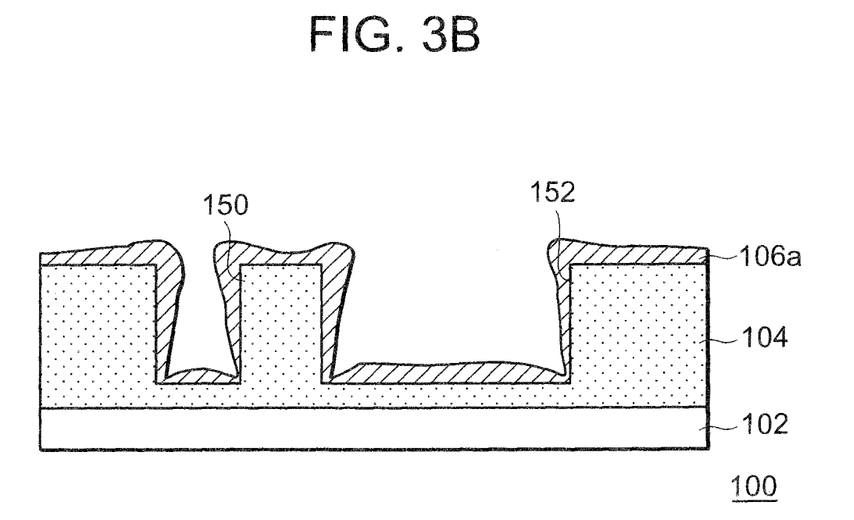

First, a narrow wiring groove 150 and a wide wiring groove 152 are formed in the interlayer dielectric film 104 (FIG. 3A) Then, a first barrier metal film 106a is formed over the entire surface of the interlayer dielectric film 104 by using a sputtering method (FIG. 3B). At this time, the film thickness of the first barrier metal film 106a becomes uneven at the side walls of the narrow wiring groove 150 and the wide wiring groove 152. The first barrier metal film 106a is deposited thickly on the upper part of the side walls of the narrow wiring groove 150 and the wide wiring groove 152. On the other hand, a part with a thin film thickness is formed in the first barrier metal film 106a at the lower part of the narrow wiring groove 150 and the wide wiring groove 152, and a region may be created where the first barrier metal film 106a is not formed over the side wall of the interlayer dielectric film 104. When the interlayer dielectric film 104 is not covered with the first barrier metal film 106a and the interlayer dielectric film 104 is exposed, it is impossible for it to function as the barrier metal. Therefore, a process for etching the barrier metal film and planarizing the film thickness of the barrier metal over the sidewall of the wiring groove is conventionally carried out.

Figure 4A:
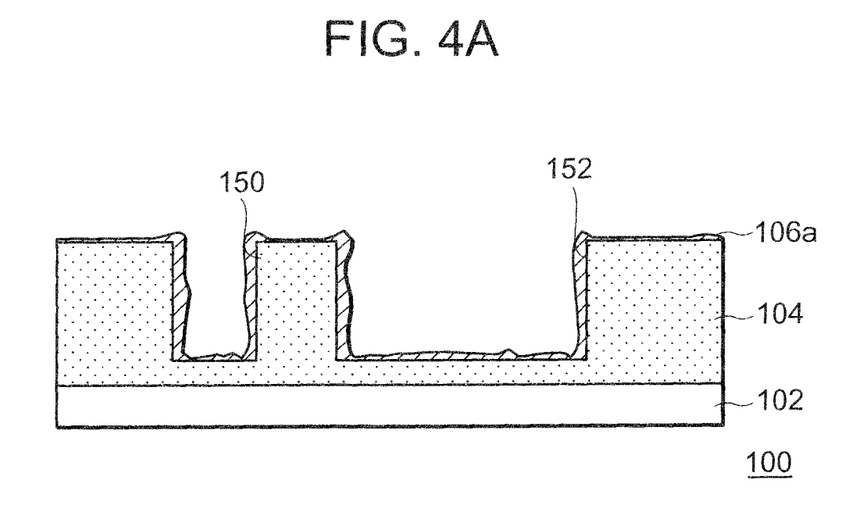
FIG. 4A and FIG. 4B are process cross-sectional drawings illustrating a manufacturing procedure of the semiconductor device in the embodiment of the present invention.

In this embodiment, by etching the first barrier metal film 106a, a process for planarizing the film thickness of the first barrier metal film 106a over the sidewalls of the narrow wiring groove 150 and the wide wiring groove 152. By etching the first barrier metal film 106a, the upper surface of the interlayer dielectric film 104, except for the region where the narrow wiring groove 150 and the wide wiring groove 152 are formed, and the first barrier metal film 106a over the bottom surfaces of the narrow wiring groove 150 and the wide wiring groove 152 are removed, thereby, the removed first barrier metal film 106a is adhered over the sidewalls of the narrow wiring groove 150 and the wide wiring groove 152 (FIG. 4A). As a result, the film thickness of the first barrier metal film 106a over the sidewalls of the narrow wiring groove 150 and the wide wiring groove 152 can be planarized, and a configuration can be produced where the first barrier metal film 106a is formed over the entire surface of the interlayer dielectric film 104.

Figure 4B:
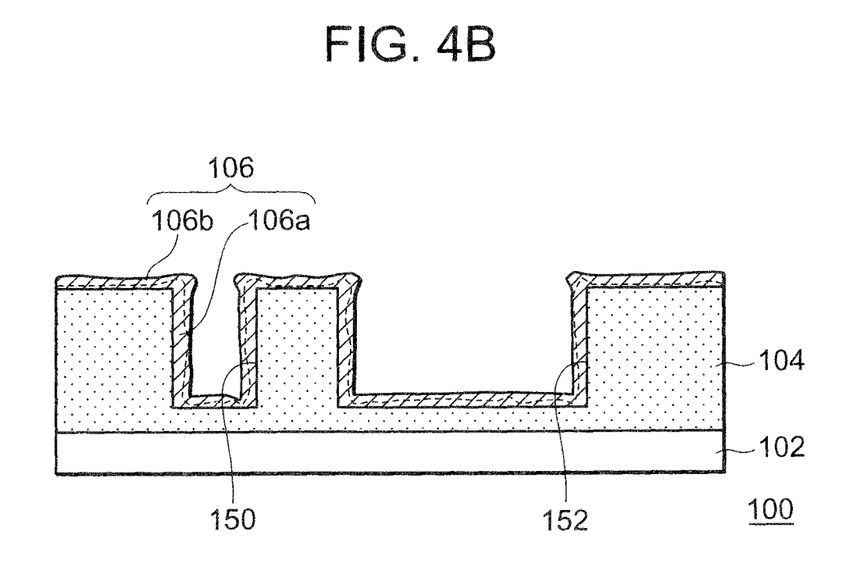

In this embodiment, in addition to the aforementioned etching, the second barrier metal film 106b is formed again over the entire surface of the interlayer film 104 by using a sputtering method (FIG. 4B). As a result, the unevenness of the film thickness of the barrier metal film 106 over the sidewalls of the narrow wiring groove 150 and the wide wiring groove 152 is decreased further (hereinafter, the first barrier metal film 106a and the second barrier metal film 106b are combined to show the barrier metal film 106).

Herein, the first barrier metal film 106a and the second barrier metal film 106b may be composed of the same material. The first barrier metal film 106a and the second barrier metal film 106b contain, for instance, a high melting point metal such as Ti, W, and Ta, etc. For instance, Ti, TiN, W, WN, Ta, and TaN, etc. are illustrated as a preferable barrier metal film. For instance, a stacking structure, etc. of TaN and Ta may be used as a barrier metal film. In this case, sputtering, etching, and re-sputtering may be performed on each layer.

Then, a first seed alloy film 108a is formed over the entire surface of barrier metal film 106 by using a sputtering method (FIG. 5A) Here, the first seed alloy film 108a may include an alloy containing the aforementioned impurity metal. The concentration of the impurity metal may be controlled to be about 0.1 to 1.0 W %. By making it to be within such a range, the plated film containing copper as a main component can be excellently formed afterwards using the seed alloy film as the seed.

"Alloy" in this specification means one in which two or more metal elements are melted and solidified, and one containing a nonmetal and a metalloid element in addition to a metal element is also called an alloy. Moreover, as the structure of the alloy, according to the method for mixing the component elements, there is a case where a solid solution and an intermetallic compound are formed and a case where they exist as a mixture. Specifically, within this specification, one in which an element is added in excess of the solid solubility limit is called an "alloy" (Encyclopedia Dictionary of Chemistry published by TOKYO KAGAKU DOJIN Co., LTD)

Figure 5A:
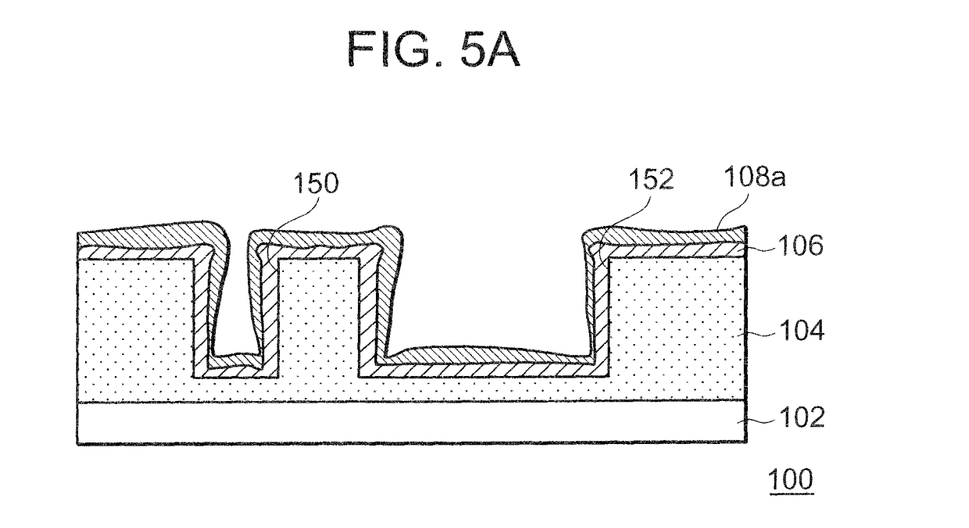
FIG. 5A and FIG. 5B are process cross-sectional drawings illustrating a manufacturing procedure of the semiconductor device in the embodiment of the present invention.

At this time, the film thickness of the first seed alloy film 108a becomes uneven over the side walls of the narrow wiring groove 150 and the wide wiring groove 152, just as it is in the case of forming the first barrier metal film 106a. The first seed alloy film 108a is deposited thickly at the upper part of the side walls of the narrow wiring groove 150 and the wide wiring groove 152. On the other hand, a part with a thin film thickness of the first seed alloy film 108a is formed at the lower part of the sidewalls of the narrow wiring groove 150 and the wide wiring groove 152, and a region is created where the first seed alloy film 108a maybe not formed over the side wall of the barrier metal film 106. If there is a region where the first seed alloy film 108a is not formed, the plated film is not formed excellently when the plated film is formed afterwards. Therefore, conventionally, a process is performed for planarizing the film thickness of the seed film over the sidewall of the wiring groove by etching the seed film.

Figure 5B:
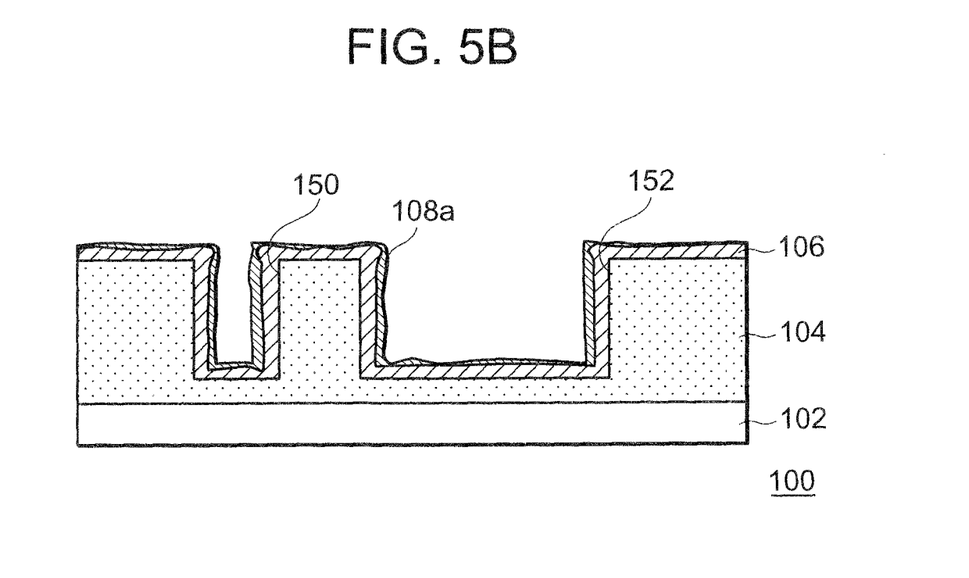

In this embodiment, a process is performed for planarizing the film thickness of the seed alloy film 108a over the sidewalls of the narrow wiring groove 150 and the wide wiring groove 152 by etching the first seed alloy film 108a. By etching the first seed alloy film 108a, the upper surface of the interlayer dielectric film 104, except for the region where the narrow wiring groove 150 and the wide wiring groove 152 is formed, and the first seed alloy film 108a over the bottom surfaces of the narrow wiring groove 150 and the wide wiring groove 152 are removed, thereby, the removed first seed alloy film 108a is adhered over the sidewalls of narrow wiring groove 150 and the wide wiring groove 152 (FIG. 5B).

Figure 6A:
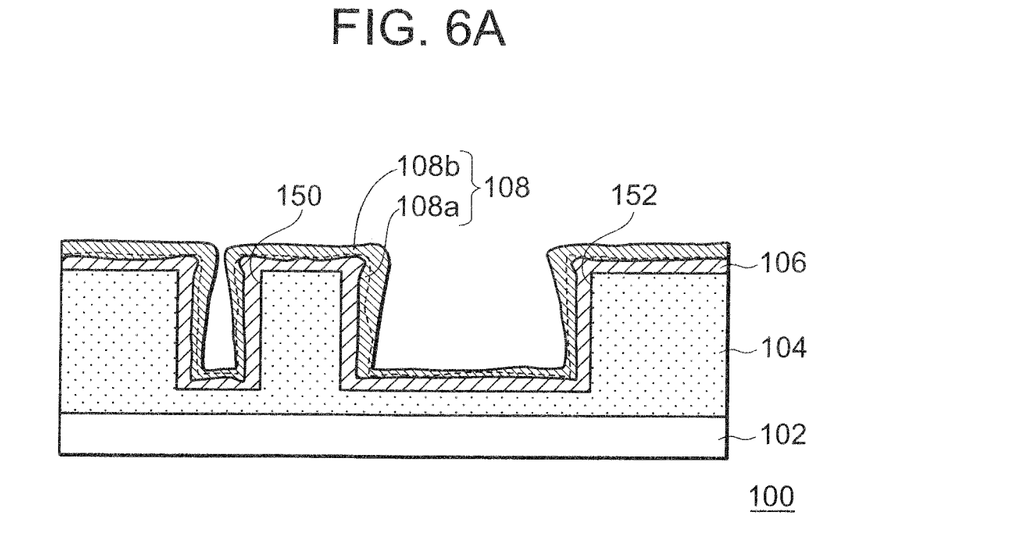
FIG. 6A and FIG. 6B are process cross-sectional drawings illustrating a manufacturing procedure of the semiconductor device in the embodiment of the present invention.
Figure 6B:
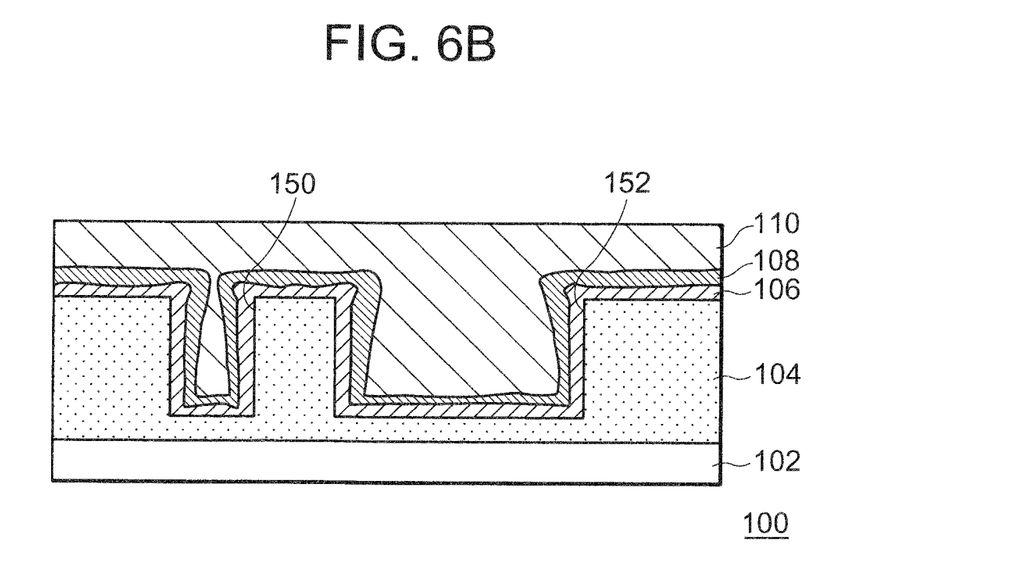

In this embodiment, in addition to the aforementioned etching, the second seed alloy film 108b is formed again over the entire surface of the interlayer film 104 by using a sputtering method (FIG. 6A). Herein, a configuration may be taken in which the second seed alloy film 108b contains the same material as the first seed alloy film 108a. As a result, the unevenness of the film thickness of the seed alloy film 108 over the side walls of the narrow wiring groove 150 and the wide wiring groove 152 is reduced. Moreover, the overhang portion where seed alloy film 108 adheres thickly is formed at the upper part in the narrow wiring groove 150 with a narrow wiring width.

Next, a plated metal film 110 is formed by a plating method to embed the narrow wiring groove 150 and the wide wiring groove 152 (FIG. 6B) The plated metal film 110 may have a configuration containing copper as a main component. The plated metal film 110 may have a configuration containing an impurity metal, but the impurity concentration thereof should be made lower than that of the first seed alloy film 108a and the second seed alloy film 108b.

Figure 7A:
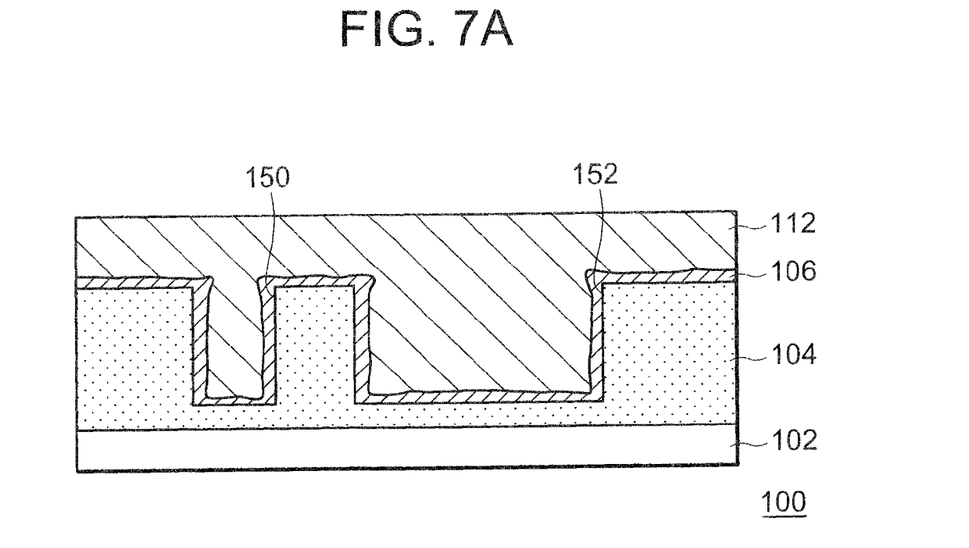
FIG. 7A and FIG. 7B are process cross-sectional drawings illustrating a manufacturing procedure of the semiconductor device in the embodiment of the present invention.

Next, annealing is performed. Thereby, the impurity metal in the seed alloy film 108 is diffused. Hereinafter, the seed alloy film 108 is combined with the plated metal film 110 and is shown as a wiring metal 112 (FIG. 7A). Here, in the narrow wiring groove 150, the concentration of the impurity metal becomes higher at the upper part of the narrow wiring groove 150 because the overhung portion is formed. On the other hand, in the wide wiring groove 152, the concentration of the impurity metal at the surface is little affected by the impurity metal in the seed alloy film 108 formed over the sidewall because the width of the wiring is wide. Therefore, as shown in FIG. 2, the concentration of the impurity metal is highest at the bottom surface of the wide wiring groove 152 and the concentration of the impurity metal becomes lower in other areas.

Grains of copper in the plated metal film 110 in the narrow wiring groove 15 and the wide wiring groove 152 are grown by annealing. Here, because of the bottom-up characteristics, the smaller the wiring width the thicker the plated film thickness of the plated metal film 110. Generally, the grain size after annealing becomes greater when the thickness of plated film is thicker. Therefore, the grain size of the plated metal film becomes greater in the narrow wiring groove 150 than in the wide wiring groove 152. Moreover, the impurity metal diffuses along the grain boundaries of copper. As a result, the diffusion rate thereof becomes smaller in the case of a large grain size than in the case of a small grain size. Specifically, the diffusion rate of the impurity metal in the narrow wiring groove 150 with narrow wiring width is smaller than that of the wide wiring groove 152. Therefore, in the narrow wiring groove 150 with narrow wiring width, the wiring metal 112 comes to have a concentration profile where the concentration profile of the seed alloy film 108 and the plated metal film 110 before annealing is maintained as is, to some extent. On the other hand, because the diffusion rate of the impurity metal is large in the wide wiring groove 152, the impurity metal is diffused more uniformly in the plated metal film 110 in the wide wiring groove 152.

Figure 7B:
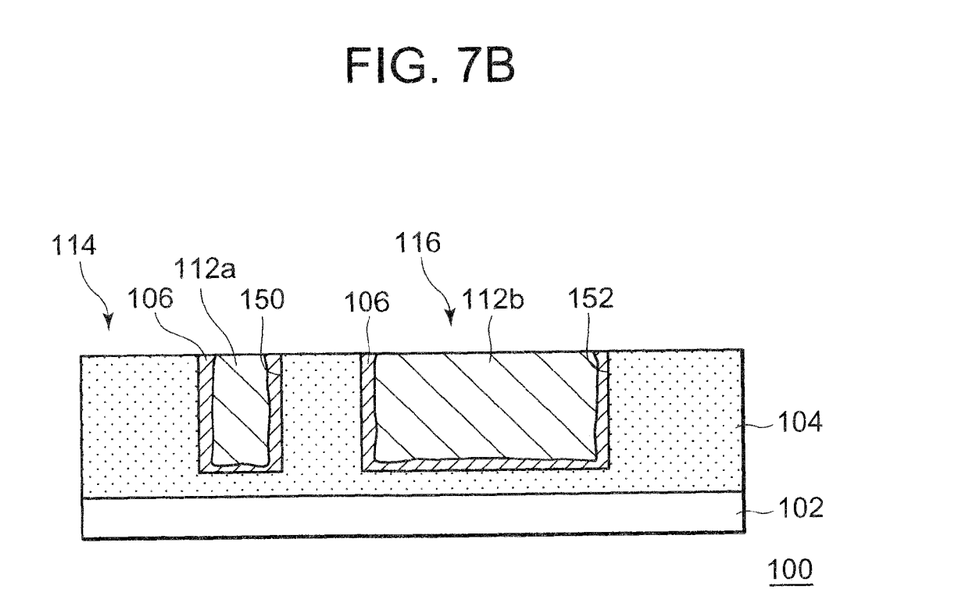

After that, the plated metal film 110, the seed alloy film 108, and the barrier metal film 106 exposed to the outside of the narrow wiring groove 150 and the wide wiring groove 152 are removed by using Chemical Mechanical Polishing (CMP) As a result, the narrow wiring 114 is formed in the narrow wiring groove 150 and the wide wiring 116 is formed in the wide wiring groove 152 (FIG. 7B).

Afterwards, the cap film 120 is formed over the interlayer dielectric film 104. The cap film 120 may be, for instance, a SiCN film. As a result, the semiconductor device 100 may have the configuration shown in FIG. 1.

Figure 8:
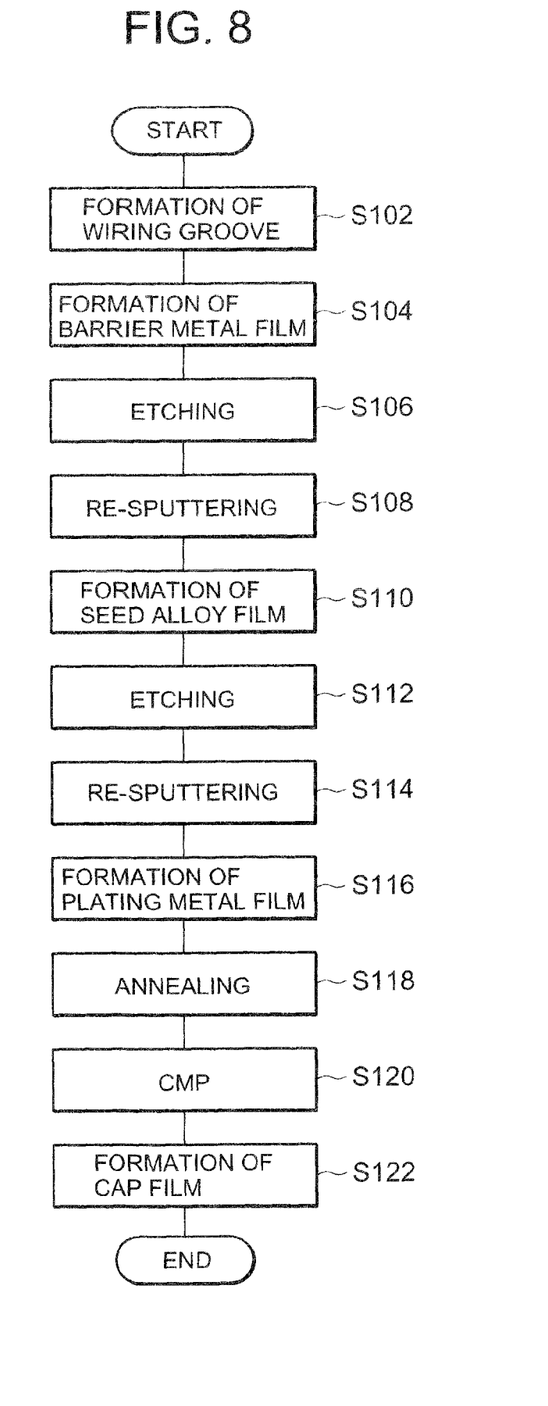
FIG. 8 is a flow chart illustrating a manufacturing procedure of the semiconductor device in the embodiment of the present invention.

FIG. 8 is a flow chart illustrating a manufacturing procedure of the semiconductor device in this embodiment. First of all, the wiring grooves, such as the narrow wiring groove 150 and the wide wiring groove 152, etc. are formed in the interlayer dielectric film 104 (S102). Then, the first barrier metal film 106a is formed over the entire surface of the interlayer dielectric film by using a sputtering method (S104). Next, the first barrier metal film 106a is etched (S106). After that, by using re-sputtering method, the second barrier metal film 106b is formed over the first barrier metal film 106a (re-sputtering, S108). As a result, the barrier metal film 106 is formed.

In continuation, the first seed alloy film 108a is formed over the entire surface of the barrier metal film 106 (S110), and the first seed alloy film 108a is etched (S112) Afterwards, by using a re-sputtering method, the second seed alloy film 108b is formed over the first seed alloy film 108a (re-sputtering, S114) As a result, the seed alloy film 108 is formed.

In continuation, the plated metal film 110 is formed over the seed alloy film 108 by using the plating method to embed the narrow wiring groove 150 and the wide wiring groove 152 (S116). Then, annealing is performed (S118) As a result, the impurity metal in the seed alloy film 108 is diffused in the plated metal film 110 to form the wiring metal 112. At this time, the concentration profile of the impurity metal in each wiring groove becomes the state shown in FIG. 2.

Afterwards, using CMP, the narrow wiring 114 and the wide wiring 116 are formed by removing the wiring metal 112 and the barrier metal film 106 which are exposed to the outside of the narrow wiring groove 150 and the wide wiring groove 152 (S120) Afterwards, the cap film 120 is formed over the interlayer dielectric film 104 (S122).

EMBODIMENTS

First Example

Figure 9:
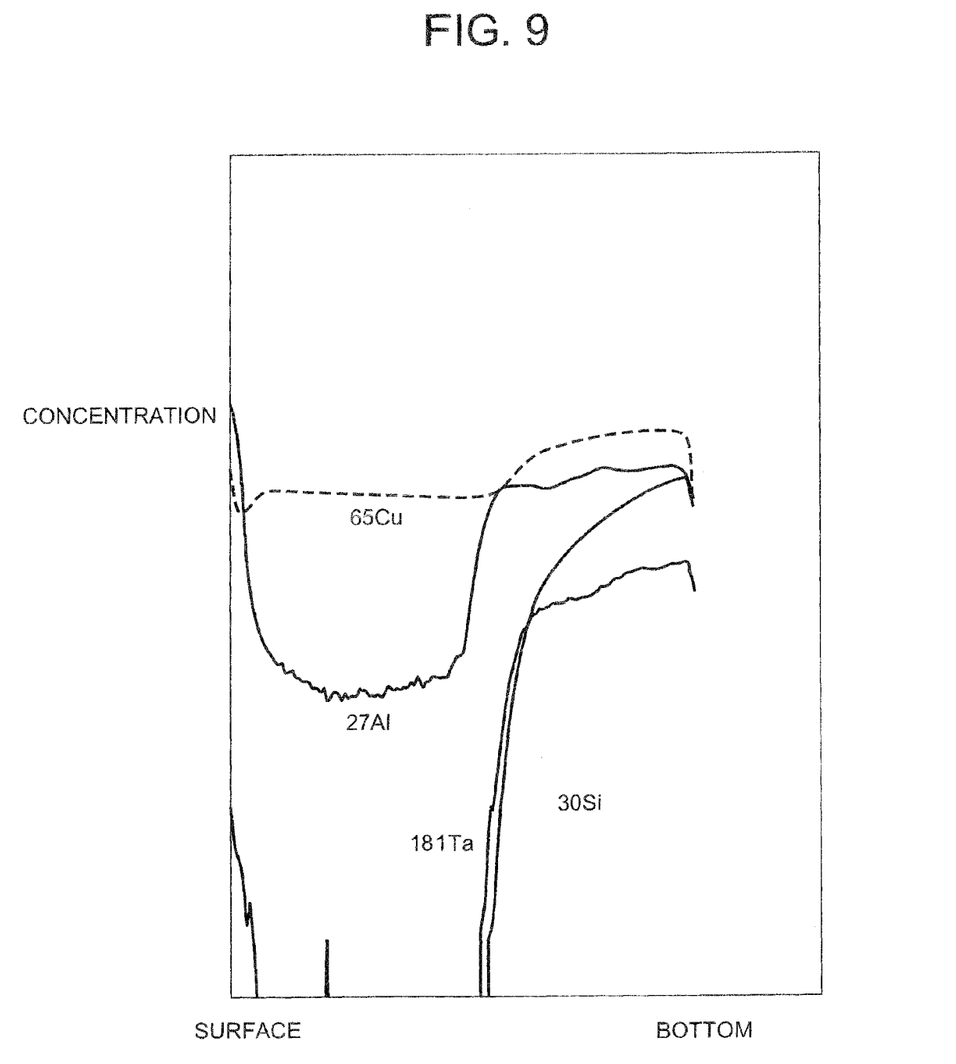
FIG. 9 is a diagram illustrating concentration profiles of the first wiring metals in the narrow wiring.

A semiconductor device was manufactured by using the manufacturing procedure of the semiconductor device described and referred to from FIG. 1 and FIG. 3 to FIG. 7 and FIG. 8. FIG. 9 is a drawing illustrating concentration profiles of the impurity metals in the narrow wiring 114. Herein, an example using Al as an impurity metal is shown. The wiring width was assumed to be 90 nm. As shown in the figure, the concentration of Al becomes higher at the surface of the wiring. Moreover, when the cross-sectional photograph of the manufactured wiring was confirmed, an excellent wiring was formed without the creation of voids, etc.

Second Example

Similarly to the first example, neither etching of the step S112 nor the re-sputtering process of S114 in FIG. 8 have been carried out. In this case, when the cross-sectional photograph of the manufactured wiring was confirmed, voids were created over the side wall in the wiring groove. It is considered that the seed alloy film did not work as a seed and the plated film was not formed well.

Next, the effect of a semiconductor device 100 in this embodiment is described.

According to the aspect of the semiconductor device 100 in this embodiment, the highly concentrated impurity metal is formed at the surface of the narrow wiring 114, so that migration of copper ions are suppressed at the interface of the cap layer 120, etc. formed thereon. As a result, the breakdown voltage between the wirings is improved, and a decrease in the TDDB lifetime can be suppressed. Especially, when a low-permittivity film is used, the decrease in TDDB lifetime occurs easily. However, according to the semiconductor device 100 of this embodiment, the decrease in the TDDB lifetime can be suppressed even if a low-permittivity film is used for the interlayer dielectric film 104.

On the other hand, although the wide wiring 116 with a wide width also contains the impurity metal, there is an attempt make a configuration where the concentration of impurity at the surface is not made as high as the narrow wiring 114 and to make the concentration of impurity in the wiring more uniform. Therefore, the SIV tolerance can be effectively improved without causing an unnecessary increase in the resistance of the wiring in the wide wiring 116.

According to the aspect of the configuration of the semiconductor device 100 in this embodiment, in the semiconductor device which includes a wide wiring and a narrow wiring, since configurations are taken to have appropriate concentration profiles of the impurity, respectively, the decrease of TDDB lifetime in the narrow wiring and SIV in the wide wiring are effectively prevented simultaneously.

The embodiments of the present invention have been described referring to the drawings, and these are examples of the present invention and various compositions other than the above can be adopted.

In the aforementioned embodiments, an example in which the narrow wiring 114 and the wide wiring 116 were formed in the same layer was explained, and the narrow wiring 114 and the wide wiring 116 may be made in different layers. In this case, by forming the narrow wiring and wide wiring, respectively, using the same procedure as the one described above, a wiring metal having the same concentration profile as the narrow wiring 114 is formed in the narrow wiring with a narrow width and the wiring metal having the same concentration profile as the wide wiring 116 is formed in the wide wiring with a wide width.

Figure 10:
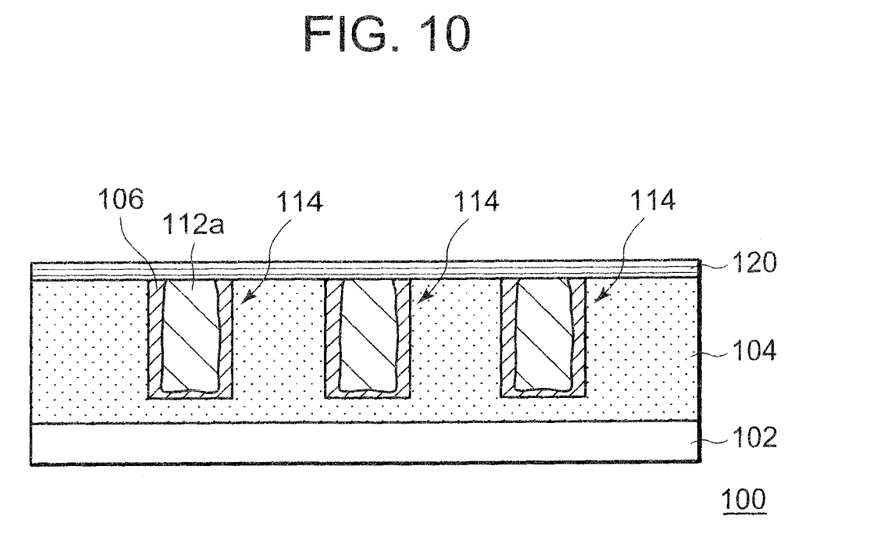
FIG. 10 is a cross-sectional drawing illustrating a configuration of the narrow wiring in the embodiment of the present invention.

Moreover, the manufacturing procedure of the semiconductor device 100 in the aforementioned embodiment can be applied to a configuration where plural narrow wirings 114 have a fine pitch as shown in FIG. 10. In the region where plural narrow wirings 114 are formed with a fine pitch, a decrease in TDDB lifetime easily occurs. The decrease in TDDB lifetime can be effectively suppressed by applying the manufacturing procedure of the semiconductor device 100 in the aforementioned embodiment to such a configuration.

In the aforementioned embodiment, a procedure of sputtering, etching, and re-sputtering was shown for manufacturing the barrier metal film 106. However, the barrier metal film 106 is not limited to this method and other various procedures may be applied. For instance, the step for re-sputtering may be omitted. In addition, for instance, a CVD method may be applied to form it.

Moreover, the narrow wiring 114 and the wide wiring 116 may be applied to either a single-damascene method or a dual-damascene method.

What is claimed is:

1. A semiconductor device comprising:
   a substrate;
   an insulator film formed over the substrate;
   a plurality of metal wirings with different widths in a first direction which are formed in the insulator film, contains copper as a main component, and contains an impurity metal which is different from copper,
   the metal wiring having a thickness in a second direction perpendicular to the first direction,
   wherein the plurality of metal wirings includes:
   a first metal wiring with a concentration profile in the second direction in which the concentration of the impurity metal increases, in the second direction, from a center part of the first metal wiring to an upper surface of the first metal wiring; and
   a second metal wiring with a concentration profile of the second direction in which the concentration of the impurity metal decreases, in the second direction, from a bottom surface of the second metal wiring to an upper surface of the second metal wiring, and
   wherein the width of the second metal wiring is larger than the width of the first metal wiring, and the first metal wiring has a minimum wiring pitch in the semiconductor device.

2. The semiconductor device according to claim 1, wherein the impurity metal includes one selected from the group of Be, Mg, Zn, Pd, Ag, Cd, Au, Hg, Pt, Si, Zr, Al, and Ti.

3. The semiconductor device according to claim 1, wherein the first metal wiring and the second metal wiring are formed in the same layer.

4. The semiconductor device according to claim 1, wherein the second metal wiring has a maximum width in the semiconductor device.

5. The semiconductor device according to claim 1, wherein the first metal wiring has a minimum wiring pitch in the semiconductor device, and wherein the second metal wiring has a maximum width in the semiconductor device.

6. A semiconductor device, comprising:
   a substrate;
   a first metal wiring which is formed over the substrate, contains copper as a main component, and contains an impurity metal which is different from copper;
   a second metal wiring which is formed over the substrate, contains copper as a main component, contains an impurity metal which is different from copper, and is wider than the first metal wiring in a first direction,
   the first metal wiring and the second metal wiring having a thickness in a second direction perpendicular to the first direction,
   wherein the first metal wiring has a concentration profile of the second direction in which the concentration of the impurity metal increases, in the second direction from a center part of the first metal wiring to an upper surface of the first metal wiring, the concentration of the impurity metal of the surface of the first metal wiring is higher than the concentration of the impurity metal of an upper surface of the second metal wiring, and the first metal wiring has a minimum wiring pitch in the semiconductor device.

7. The semiconductor device according to claim 6, wherein the second metal wiring has a different concentration profile of the impurity metal in the second direction from the concentration profile of the impurity metal in the second direction of the first metal wiring.

8. The semiconductor device according to claim 6, wherein the second metal wiring has a concentration profile in which the concentration of the impurity metal decreases from a bottom surface in the second direction to the surface.

9. The semiconductor device according to claim 6, wherein the impurity metal is one selected from the group of Be, Mg, Zn, Pd, Ag, Cd, Au, Hg, Pt, Si, Zr, Al, and Ti.

10. The semiconductor device according to claim 6, wherein the first metal wiring and the second metal wiring are formed in the same layer.

11. The semiconductor device according to claim 6, wherein the second metal wiring has a maximum width in the semiconductor device.

12. The semiconductor device according to claim 1, wherein the concentration of the impurity metal of the surface of the first metal wiring is higher than the concentration of the impurity metal of the surface of the second metal wiring.

* * * * *